(12) United States Patent
Lee et al.

(10) Patent No.: US 12,554,160 B2
(45) Date of Patent: Feb. 17, 2026

(54) TREATMENT LIQUID EJECTION METHOD AND APPARATUS

(71) Applicant: SEMES CO., LTD., Cheonan-si (KR)

(72) Inventors: Jun Seok Lee, Cheonan-si (KR); Beomjeong Oh, Cheonan-si (KR); Subeom Jeon, Cheonan-si (KR); Jeong Ho Jo, Anyang-si (KR)

(73) Assignee: Semes Co., LTD., Cheonan-si (KR)

( * ) Notice: Subject to any disclaimer, the term of this patent is extended or adjusted under 35 U.S.C. 154(b) by 504 days.

(21) Appl. No.: 18/302,287

(22) Filed: Apr. 18, 2023

(65) Prior Publication Data

US 2023/0352319 A1 Nov. 2, 2023

(30) Foreign Application Priority Data

May 2, 2022 (KR) .................... 10-2022-0054249

(51) Int. Cl.
*H01L 21/67* (2006.01)
*G02F 1/1335* (2006.01)
*H01L 21/02* (2006.01)

(52) U.S. Cl.
CPC .. *G02F 1/133516* (2013.01); *H01L 21/02052* (2013.01); *H01L 21/67051* (2013.01); *H01L 21/6715* (2013.01)

(58) Field of Classification Search
CPC ......... G02F 4/133516; H01L 21/02052; H01L 21/0201
See application file for complete search history.

(56) References Cited

U.S. PATENT DOCUMENTS

2006/0158474 A1\* 7/2006 Van Dam ............ G03F 7/70791
347/19
2012/0268510 A1\* 10/2012 Kojima ................ B41J 2/16579
347/47

FOREIGN PATENT DOCUMENTS

| KR | 10-2006-0038439 A | 5/2006 |
| KR | 100833232 B1 | 5/2008 |
| KR | 2008-0065874 A | 7/2008 |
| KR | 10-2011-0110275 A | 10/2011 |
| KR | 101361456 B1 | 2/2014 |
| KR | 2016-0031201 A | 3/2016 |
| KR | 2020-0105885 A | 9/2020 |

OTHER PUBLICATIONS

Office Action for Korean Application No. 10-2022-0054249 dated Aug. 22, 2024.

\* cited by examiner

*Primary Examiner* — Nathan T Leong
(74) *Attorney, Agent, or Firm* — Harness, Dickey & Pierce, P.L.C.

(57) ABSTRACT

Provided is a treatment liquid ejection method and apparatus capable of significantly increasing productivity and quality by greatly reducing a maintenance time of a head unit, the treatment liquid ejection method including (a) obtaining test image information by test-photographing a treatment liquid test-printed by a head unit, (b) generating nozzle-specific characteristic information by using the test image information, (c) generating print file information to be printed, in consideration of the nozzle-specific characteristic information, (d) reflecting recipe information of a substrate or the head unit to prepare the print file information in an output-table state, and (e) printing, on the substrate by the head unit, the print file information to which the recipe information is reflected.

11 Claims, 12 Drawing Sheets

TREATMENT LIQUID EJECTION METHOD AND APPARATUS

CROSS-REFERENCE TO RELATED PATENT APPLICATION

This application claims the benefit of Korean Patent Application No. 10-2022-0054249, filed on May 2, 2022, in the Korean Intellectual Property Office, the disclosure of which is incorporated herein in its entirety by reference.

BACKGROUND OF THE INVENTION

1. Field of the Invention

The present invention relates to a treatment liquid ejection method and apparatus and, more particularly, to a treatment liquid ejection method and apparatus capable of significantly increasing productivity and quality by greatly reducing a maintenance time or downtime of a head unit.

2. Description of the Related Art

In general, currently, display devices which are electro-optical devices called liquid crystal devices, electroluminescent devices, etc. are being widely used in electronic devices such as mobile phones, portable computers, smart pads, and televisions, and full-color display by the display devices is increasing.

Full-color display by the liquid crystal devices may be realized by, for example, passing, through a color filter, light modulated by a liquid crystal layer. The color filter may be formed by, for example, arranging dot-shaped red (R), green (G), and blue (B) filter elements in a certain array called a stripe array, a delta array, or a mosaic array on the surface of a substrate made of glass or the like.

Photolithography is known as a method of patterning filter elements of various colors such as R, G, and B. However, when photolithography is used, process complexity is increased or a high cost is required due to large consumption of various color materials or a photoresist.

To solve the above problems, an inkjet printing method for forming filter elements in a dot array by ejecting a material of each filter element (e.g., ink) by using an inkjet scheme for ejecting droplets onto a glass substrate or the like is proposed.

In particular, the inkjet-type treatment liquid ejection apparatus market is one of the major technology-based markets emerging in the current industry, and is positioned as an important core technology in the high value-added display industry to enable room-temperature and atmosphere production beyond vacuum deposition production.

SUMMARY OF THE INVENTION

However, according to general treatment liquid ejection apparatuses, because a camera capable of inspecting a condition of nozzles is generally mounted on a head moving unit for moving a head unit, in order to inspect the head unit after a printing process of the head unit, the head unit needs to stop printing and wait until the inspection process using the camera is finished.

In addition, a significant reduction in productivity is caused by a very long file correction time for computationally calculating print file information corrected based on the characteristics of a plurality of individual nozzles after the nozzles are inspected, and a remarkable reduction in quality is also caused by frequent nozzle drying or nozzle clogging of the head unit due to a long maintenance time including the file correction time.

The present invention provides a treatment liquid ejection method and apparatus capable of enabling a substrate printing process of a head unit during a file correction time by mounting a head moving unit and an inspection stage moving unit independently, and of significantly increasing productivity and quality by greatly reducing an idle time or a downtime of the head unit by performing the substrate printing process by using print file information of a previous version and, at the same time, generating print file information of a next version in parallel. However, the scope of the present invention is not limited thereto.

According to an aspect of the present invention, there is provided a treatment liquid ejection method including (a) obtaining test image information by test-photographing a treatment liquid test-printed by a head unit, (b) generating nozzle-specific characteristic information by using the test image information, (c) generating print file information to be printed, in consideration of the nozzle-specific characteristic information, (d) reflecting recipe information of a substrate or the head unit to prepare the print file information in an outputtable state, and (e) printing, on the substrate by the head unit, the print file information to which the recipe information is reflected.

In order to allow step (d) to be performed simultaneously with step (b) while steps (b) and (c) are being sequentially performed after step (a), the print file information of step (d) may be previous version information already generated in a previous test printing process, and the test image information of step (a), the nozzle-specific characteristic information of step (b), and the print file information of step (c) may be next version information to be applied to a next substrate.

In step (a), the head unit may perform test printing at a standby position of a maintenance zone and, in step (e), the head unit may immediately move to a printing position of a printing zone and rapidly print the treatment liquid on the substrate without waiting until the test image information of step (a), the nozzle-specific characteristic information of step (b), and the print file information of step (c) are all sequentially generated.

In step (a), the test image information may include image information showing, in a form of a dot, an actual position of each impact point where the treatment liquid ejected from a specific nozzle of the head unit reaches, in step (b), the nozzle-specific characteristic information may include nozzle analysis information to which an impact point error indicting a deviation between the actual position and a correct position of the impact point is reflected per nozzle and, in step (c), the print file information may include a bitmap image or computer-aided design (CAD) file to which the nozzle-specific characteristic information is reflected.

The treatment liquid ejection method may further include (f) preparing the substrate at a printing position, before step (e).

Step (f) may include (f-1) loading the substrate onto a substrate support unit, (f-2) macroscopically primarily aligning the substrate, (f-3) microscopically secondarily aligning the substrate, and (f-4) moving the substrate to a printing start position.

A first required time for steps (a) and (d) may be less than a second required time for step (f).

The print file information of step (d), which is the previous version information, may be applied to a plurality of substrates.

Step (a) may include (a-1) transferring the head unit to a standby position of a maintenance zone, (a-2) test-printing, by the head unit, the treatment liquid on an inspection plate at the standby position, (a-3) transferring the head unit to a printing position of a printing zone, and transferring the inspection plate to a photographing position of the maintenance zone, and (a-4) obtaining, by an inspection unit, test image information by test-photographing the inspection plate.

In step (a-3), in order to allow step (e) to be performed simultaneously, the head unit may print, on the substrate, the print file information which is previous version information already generated in a previous test printing process.

According to another aspect of the present invention, there is provided a treatment liquid ejection apparatus including a substrate support unit for supporting a substrate, a head unit for ejecting a treatment liquid onto the substrate in an inkjet manner, a head moving unit for moving the head unit, and an inspection unit for inspecting a condition of the treatment liquid ejected from the head unit, wherein the inspection unit is mounted independently of the head moving unit to move or fix a camera regardless of the motion of the head unit.

The inspection unit may include an inspection plate positioned at a standby position to allow the head unit to test-eject a treatment liquid, an inspection plate moving unit for moving the inspection plate from the standby position to a photographing position, and the camera for capturing an image of the treatment liquid ejected onto the inspection plate moved to the photographing position.

The inspection unit may further include a camera moving unit for moving the camera on a basis of the photographing position.

The head moving unit may include a first moving unit for moving the head unit in a first direction, and a second moving unit for moving the head unit in a second direction, the inspection plate moving unit may move the inspection plate in the first direction, and the camera moving unit may move the camera in the second direction.

The inspection unit may further include a film supply unit for supplying a film for test printing onto the inspection plate.

The inspection plate may be provided with a porous adsorption plate to flatly adsorb the film, and the film supply unit may include an unwinding roll for supplying the film onto the inspection plate, and a winding roll for rewinding the film from the inspection plate.

The treatment liquid ejection apparatus may further include a controller for applying an inspection control signal to the inspection unit to control the inspection unit to inspect the condition of the treatment liquid ejected from the head unit during a substrate preparation time when the substrate is loaded onto the substrate support unit and aligned at a correct position.

The controller includes a test image information obtainer for obtaining test image information by test-photographing, at a photographing position, the treatment liquid test-printed by the head unit at a standby position during the substrate preparation time, a nozzle-specific characteristic information generator for generating nozzle-specific characteristic information by using the test image information, a print file information generator for generating print file information in a form of a bitmap image or computer-aided design (CAD) file to be printed, in consideration of the nozzle-specific characteristic information, a recipe information reflector for reflecting recipe information of the substrate or the head unit to prepare the print file information in an outputtable state, and a print controller for applying a print control signal to the head moving unit to move the head unit to a printing position to print the treatment liquid on the substrate based on the print file information to which the recipe information is reflected.

In order to allow the head unit to immediately move to the printing position of a printing zone and rapidly print the treatment liquid on the substrate after test printing is finished at the standby position of a maintenance zone without waiting until the test image information, the nozzle-specific characteristic information, and the print file information are sequentially generated, the controller may further include a time reduction controller for applying previous version information already generated in a previous test printing process, as the print file information used by the recipe information reflector, and generating the test image information, the nozzle-specific characteristic information, and the print file information in parallel as next version information to be applied to a next substrate.

According to another aspect of the present invention, there is provided a treatment liquid ejection method including (a) obtaining test image information by test-photographing a treatment liquid test-printed by a head unit, (b) generating nozzle-specific characteristic information by using the test image information, (c) generating print file information to be printed, in consideration of the nozzle-specific characteristic information, (d) reflecting recipe information of a substrate or the head unit to prepare the print file information in an outputtable state, and (e) printing, on the substrate by the head unit, the print file information to which the recipe information is reflected, wherein, in order to allow step (d) to be performed simultaneously with step (b) while steps (b) and (c) are being sequentially performed after step (a), the print file information of step (d) is previous version information already generated in a previous test printing process, and the test image information of step (a), the nozzle-specific characteristic information of step (b), and the print file information of step (c) are next version information to be applied to a next substrate, wherein step (a) includes (a-1) transferring the head unit to a standby position of a maintenance zone, (a-2) test-printing, by the head unit, the treatment liquid on an inspection plate at the standby position, (a-3) transferring the head unit to a printing position of a printing zone, and transferring the inspection plate to a photographing position of the maintenance zone, and (a-4) obtaining, by an inspection unit, test image information by test-photographing the inspection plate, and wherein, in step (a-3), in order to allow step (d) to be performed simultaneously, the head unit prints, on the substrate, the print file information which is previous version information already generated in a previous test printing process.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
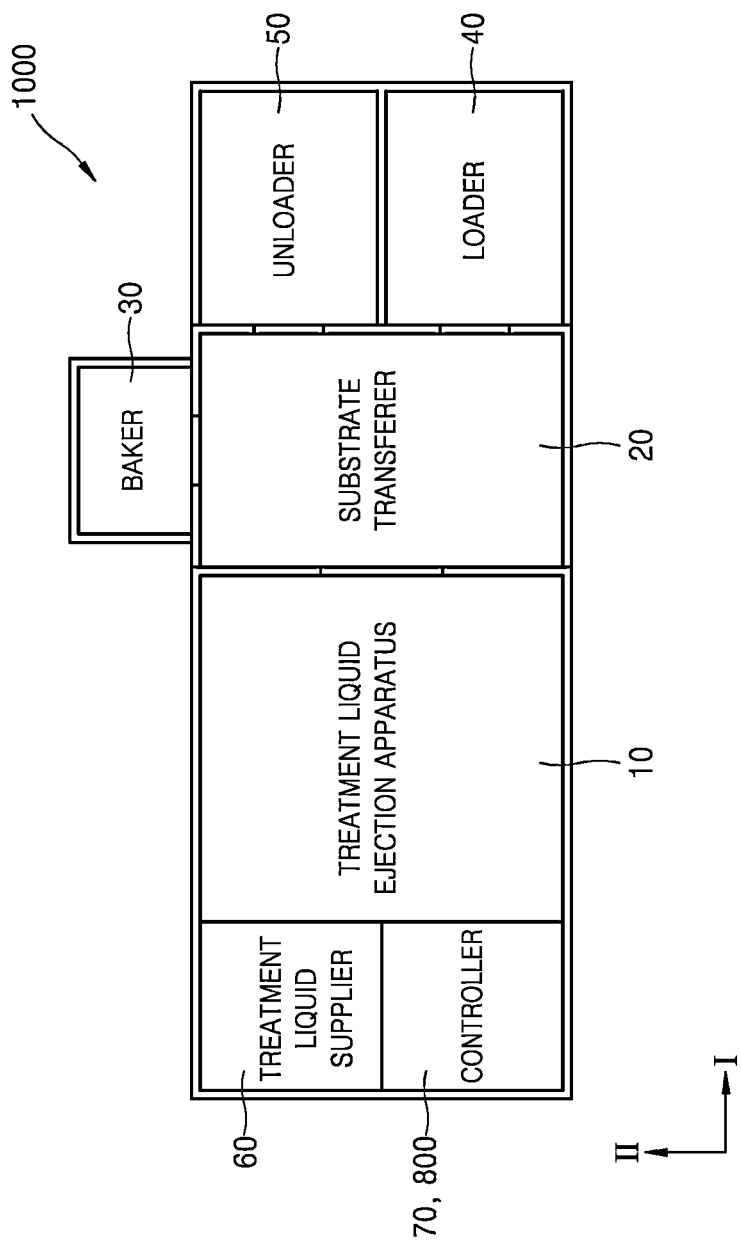
FIG. 1 is a plan view of a treatment liquid coating system including a treatment liquid ejection apparatus, according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, components, and/or groups thereof, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a plan view of a treatment liquid coating system 1000 including a treatment liquid ejection apparatus 10, according to some embodiments of the present invention.

As shown in FIG. 1, the treatment liquid coating system 1000 may coat a treatment liquid on a target object in an inkjet manner. For example, the target object may be a glass substrate, a silicon substrate, a display substrate, or a color filter substrate of a liquid crystal display panel, and the treatment liquid may be red (R), green (G), or blue (B) ink obtained by mixing pigment particles in a solvent. The ink may be coated on inner regions of a black matrix provided as a grid pattern on the color filter substrate.

The treatment liquid coating system 1000 includes the treatment liquid ejection apparatus 10, a substrate transferer 20, a baker 30, a loader 40, an unloader 50, a treatment liquid supplier 60, and a controller 70 or 800. The treatment liquid ejection apparatus 10 and the substrate transferer 20 may be disposed in a row in a first direction I and positioned adjacent to each other. The treatment liquid supplier 60 and the controller 70 or 800 may be positioned to face the substrate transferer 20 across the treatment liquid ejection apparatus 10, and disposed in a row in a second direction II.

The loader 40 and the unloader 50 may be positioned to face the treatment liquid ejection apparatus 10 across the substrate transferer 20, and disposed in a row in the second direction II. The baker 30 may be disposed adjacent to a side of the substrate transferer 20.

Herein, the first direction I may be a direction in which the treatment liquid ejection apparatus 10 and the substrate transferer 20 are arranged, the second direction II may be a direction perpendicular to the first direction I on a horizontal plane, and a third direction III may be a direction perpendicular to the first and second directions I and II.

The substrate to be coated with the treatment liquid (i.e., the ink) may be loaded into the loader 40. The substrate transferer 20 may transfer the substrate loaded into the loader 40, to the treatment liquid ejection apparatus 10. The treatment liquid ejection apparatus 10 may receive the treatment liquid from the treatment liquid supplier 60, and eject the treatment liquid onto the substrate in an inkjet manner. The substrate transferer 20 may transfer the substrate from the treatment liquid ejection apparatus 10 to the baker 30. The baker 30 may heat the substrate to evaporate a liquid material (i.e., the solvent) except for a solid component of the treatment liquid (i.e., the ink) ejected onto the substrate.

The substrate transferer 20 may transfer the substrate from the baker 30 to the unloader 50. The substrate coated with the treatment liquid may be unloaded from the unloader 50. The controller 70 or 800 may control overall operations of the treatment liquid ejection apparatus 10, the substrate transferer 20, the baker 30, the loader 40, the unloader 50, and the treatment liquid supplier 60.

Figure 2:
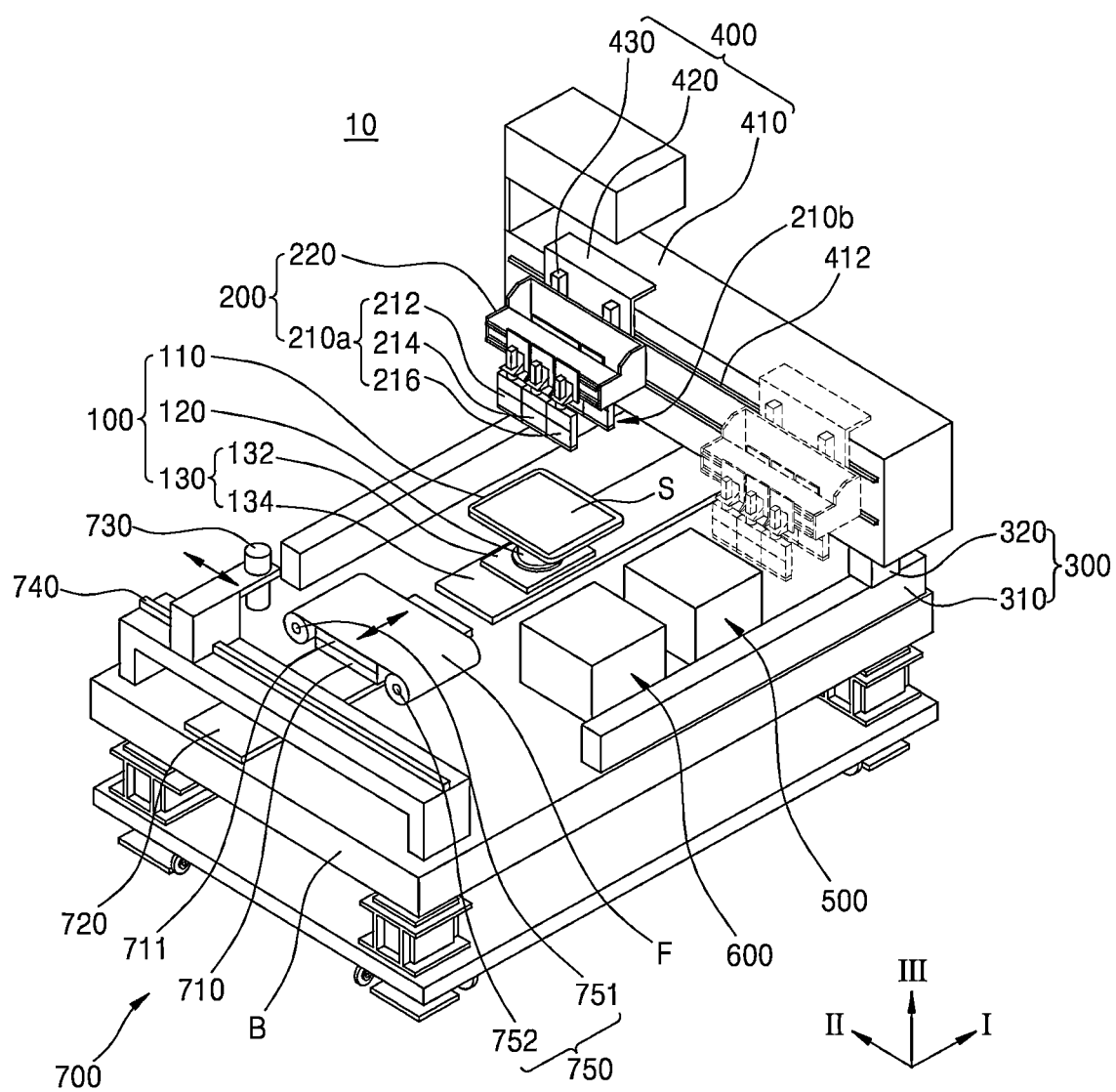
FIG. 2 is a perspective view of the treatment liquid ejection apparatus of FIG. 1.
Figure 3:
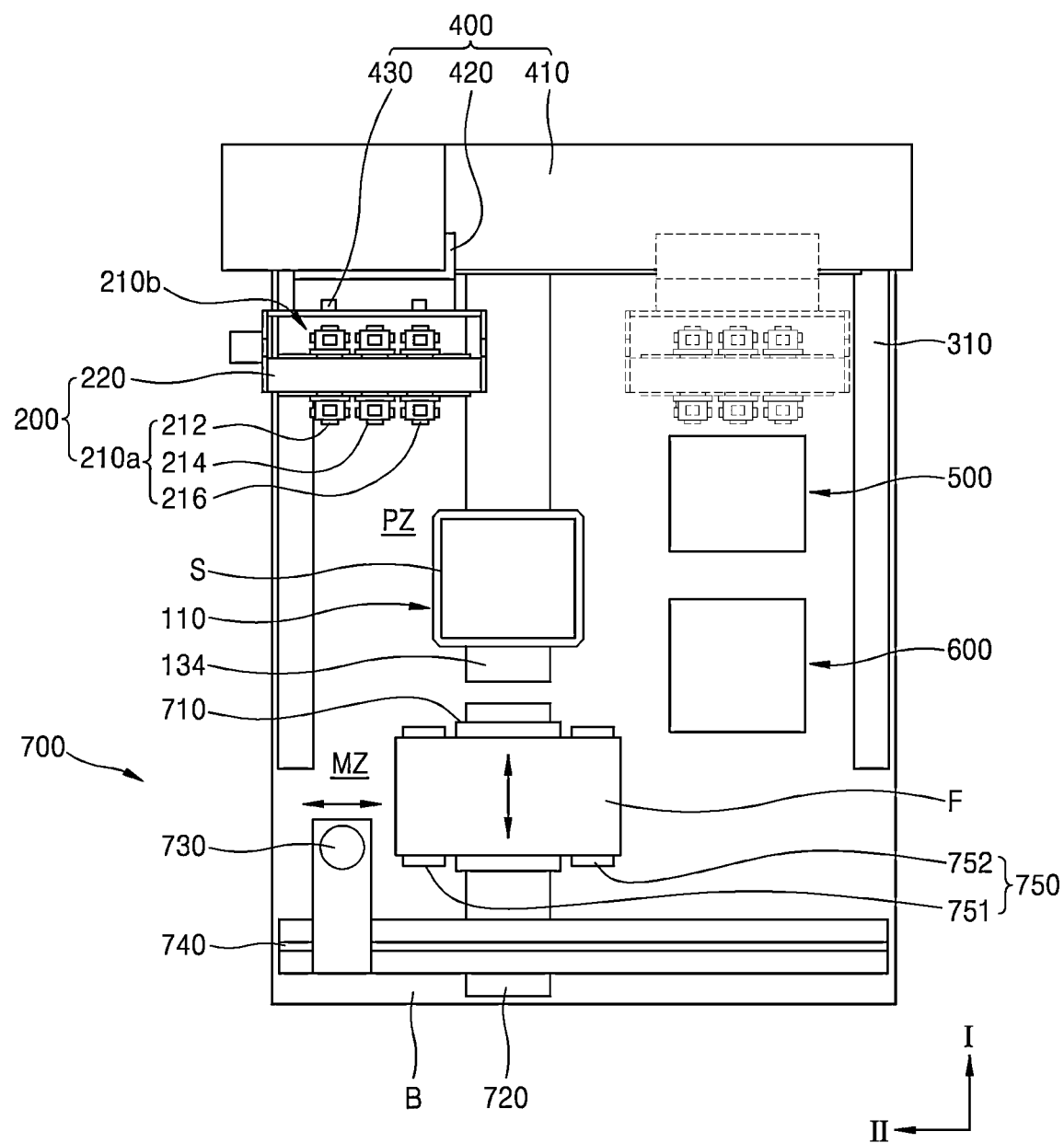
FIG. 3 is a plan view of the treatment liquid ejection apparatus of FIG. 1.

FIG. 2 is a perspective view of the treatment liquid ejection apparatus 10 of FIG. 1, and FIG. 3 is a plan view of the treatment liquid ejection apparatus 10 of FIG. 1.

As shown in FIGS. 2 and 3, the treatment liquid ejection apparatus 10 of the present invention may include a substrate support unit 100, a head unit 200, head moving units 300 and 400, head cleaning units 500 and 600, and an inspection unit 700.

The substrate support unit 100 may have a support plate 110 on which a substrate S is placed. The support plate 110 may be a rectangular plate. A rotating shaft of a rotary driving motor 120 may be connected to a bottom surface of the support plate 110. The rotary driving motor 120 may rotate the support plate 110 in such a manner that the substrate S placed on the support plate 110 is aligned at a preset position.

The support plate 110 and the rotary driving motor 120 may be linearly moved in the first direction I by a linear driving member 130. The linear driving member 130 may include a slider 132 and a guide member 134. The rotary driving motor 120 may be mounted on a top surface of the slider 132. The guide member 134 extends in the first direction I in the middle of a top surface of a base B. The slider 132 may have an embedded linear motor (not shown), and linearly move in the first direction I along the guide member 134.

The head unit 200 may eject a treatment liquid onto the substrate S. The head unit 200 may include head units 210a and 210b and a bracket 220. Among the head units 210a and 210b, one head unit 210a may be mounted on one side surface of the bracket 220 facing the first direction I, and another head unit 210b may be mounted on another side surface of the bracket 220 facing the first direction I.

Each of the head units 210a and 210b may have a red (R) head 212, a green (G) head 214, and a blue (B) head 216.

The R, G, and B heads 212, 214, and 216 may be arranged in a row in the second direction II to eject the treatment liquid onto the substrate S placed on the support plate 110 by using an inkjet scheme for ejecting droplets.

The head moving units 300 and 400 may move the head unit 200 above a path along which the support plate 110 is moved. The first moving unit 300 may linearly move the head unit 200 in the first direction I, and the second moving unit 400 may linearly move the head unit 200 in the second and third directions II and III.

The second moving unit 400 may include a horizontal support bar 410, a slider 420, and a lifting device 430. The horizontal support bar 410 may be positioned above the base B in such a manner that a longitudinal direction thereof faces the second direction II. Guide rails 412 may be provided on the horizontal support bar 410 along the longitudinal direction. The slider 420 may have an embedded linear motor (not shown), and linearly move in the second direction II along the guide rails 412. The bracket 220 of the head unit 200 may be connected to the slider 420, and the head units 210a and 210b mounted on the bracket 220 may be linearly moved in the second direction II by the linear motion of the slider 420. Meanwhile, the lifting device 430 for linearly moving the bracket 220 of the head unit 200 in the third direction III may be mounted on the slider 420.

The first moving unit 300 may include guide rails 310 and sliders 320. The guide rails 310 may have longitudinal directions facing the first direction I, and be separately disposed at two opposite edges on the top surface of the base B across the guide member 134 of the substrate support unit 100. The sliders 320 may have embedded linear motors (not shown), and linearly move in the first direction I along the guide rails 310. Both ends of the horizontal support bar 410 of the second moving unit 400 may be separately connected to the sliders 320. The second moving unit 400 including the horizontal support bar 410 may be moved in the first direction I by the linear motion of the sliders 320, and the head unit 200 connected to the second moving unit 400 may be linearly moved in the second direction II by the motion of the second moving unit 400.

The head unit 200 may be linearly moved in the first, second, and third directions I, II, and III by the first and second moving units 300 and 400, and the support plate 110 on which the substrate S is placed may be linearly moved in the first direction I by the slider 132 and the guide member 134. When the treatment liquid is ejected onto the substrate S, the head unit 200 may be fixed at a preset position, and the support plate 110 on which the substrate S is placed may be moved in the first direction I. Unlike this, the support plate 110 on which the substrate S is placed may be fixed at a preset position, and the head unit 200 may be moved in the first direction I.

The head cleaning unit 500 may periodically clean treatment liquid ejection surfaces of the head units 210a and 210b, i.e., surfaces on which nozzles for ejecting the treatment liquid are provided. Normally, after the treatment liquid ejection process is performed on one substrate, the treatment liquid ejection surfaces of the head units 210a and 210b may be cleaned.

The head cleaning units 500 and 600 may be provided at a side of the substrate support unit 100 on the top surface of the base B. The head units 210a and 210b may be moved to the top of the head cleaning units 500 and 600 by the first and second moving units 300 and 400, and moved in the first direction I above the head cleaning units 500 and 600 during the cleaning process.

The first head cleaning unit 500 may perform a purging or blading process, and the second head cleaning unit 600 may perform purging, blading, and blotting processes. The purging, blading, and blotting processes may be sequentially performed. The purging process is a process of spraying some of the treatment liquid contained in the head units 210a and 210b at high pressure. The blading process is a process of removing the treatment liquid remaining on the treatment liquid ejection surfaces of the head units 210a and 210b in a non-contact manner after the purging process. The blotting process is a process of removing the treatment liquid remaining on the treatment liquid ejection surfaces of the head units 210a and 210b in a contact manner after the blading process. However, the head cleaning units 500 and 600 are not limited thereto, and a wide variety of cleaning units are all applicable.

The inspection unit 700 serves to inspect a condition of the treatment liquid ejected from the head unit 200, and may be mounted independently of the head moving units 300 and 400 to move or fix a camera 730 regardless of the motion of the head unit 200.

Therefore, unlike a conventional case in which the inspection unit 700 may not inspect while the head unit 200 is printing and, conversely, the head unit 200 may not print while the inspection unit 700 is inspecting, according to the present invention, the inspection unit 700 may inspect while the head unit 200 is printing and, conversely, the head unit 200 may print while the inspection unit 700 is inspecting.

Figure 4:
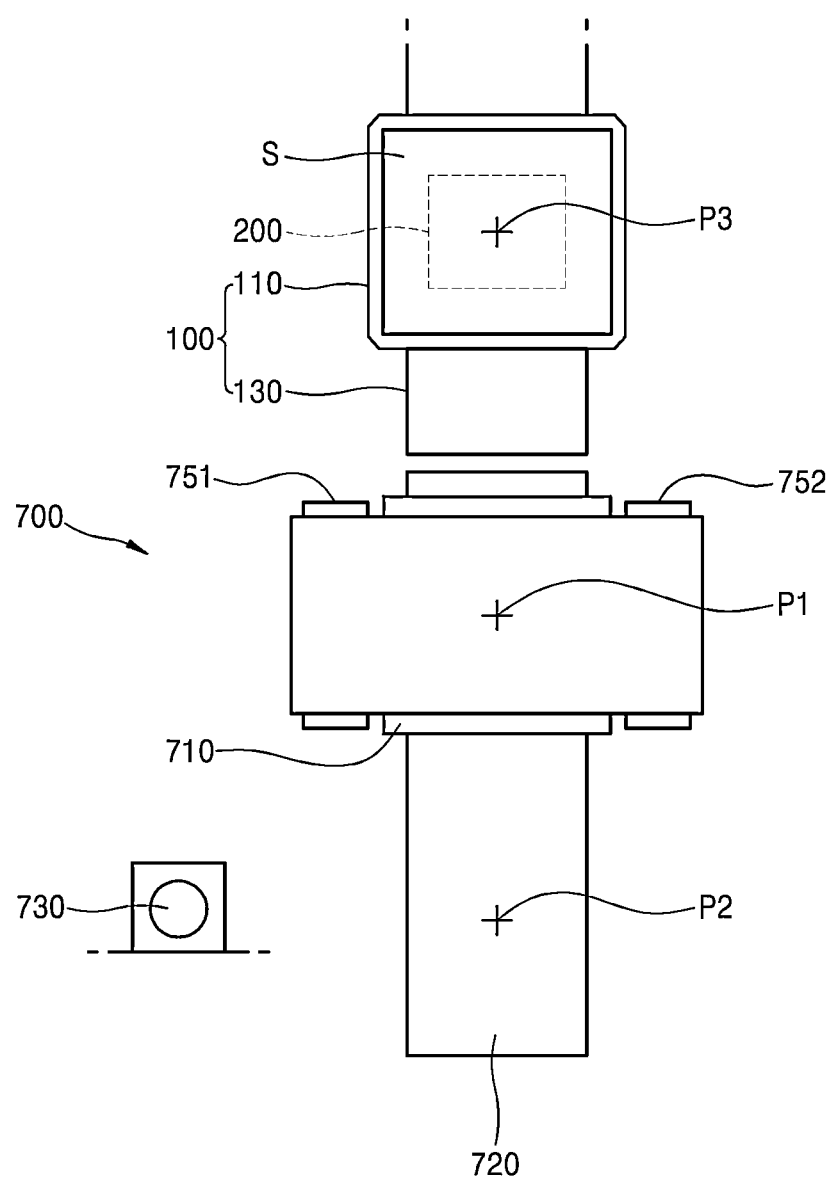
FIG. 4 is an enlarged plan view showing a printing state of the treatment liquid ejection apparatus of FIG. 3.
Figure 5:
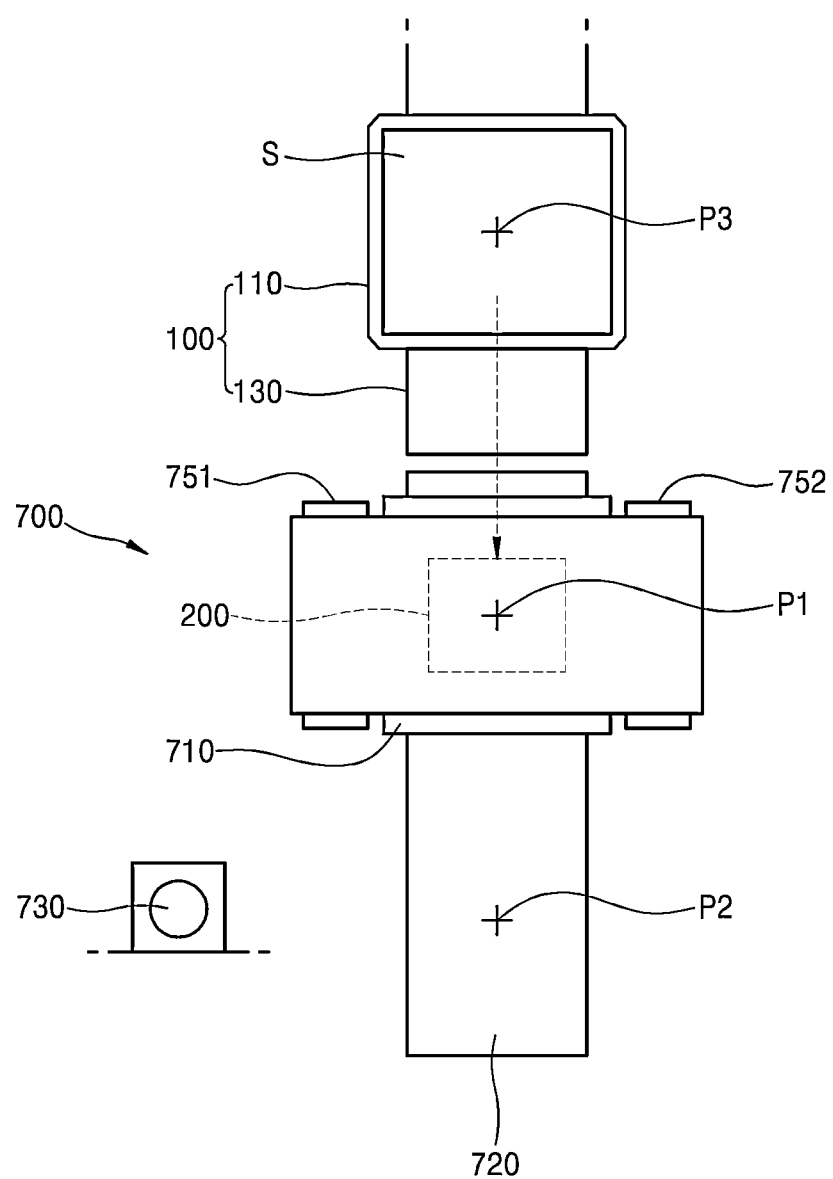
FIG. 5 is an enlarged plan view showing a test printing state of the treatment liquid ejection apparatus of FIG. 4.
Figure 6:
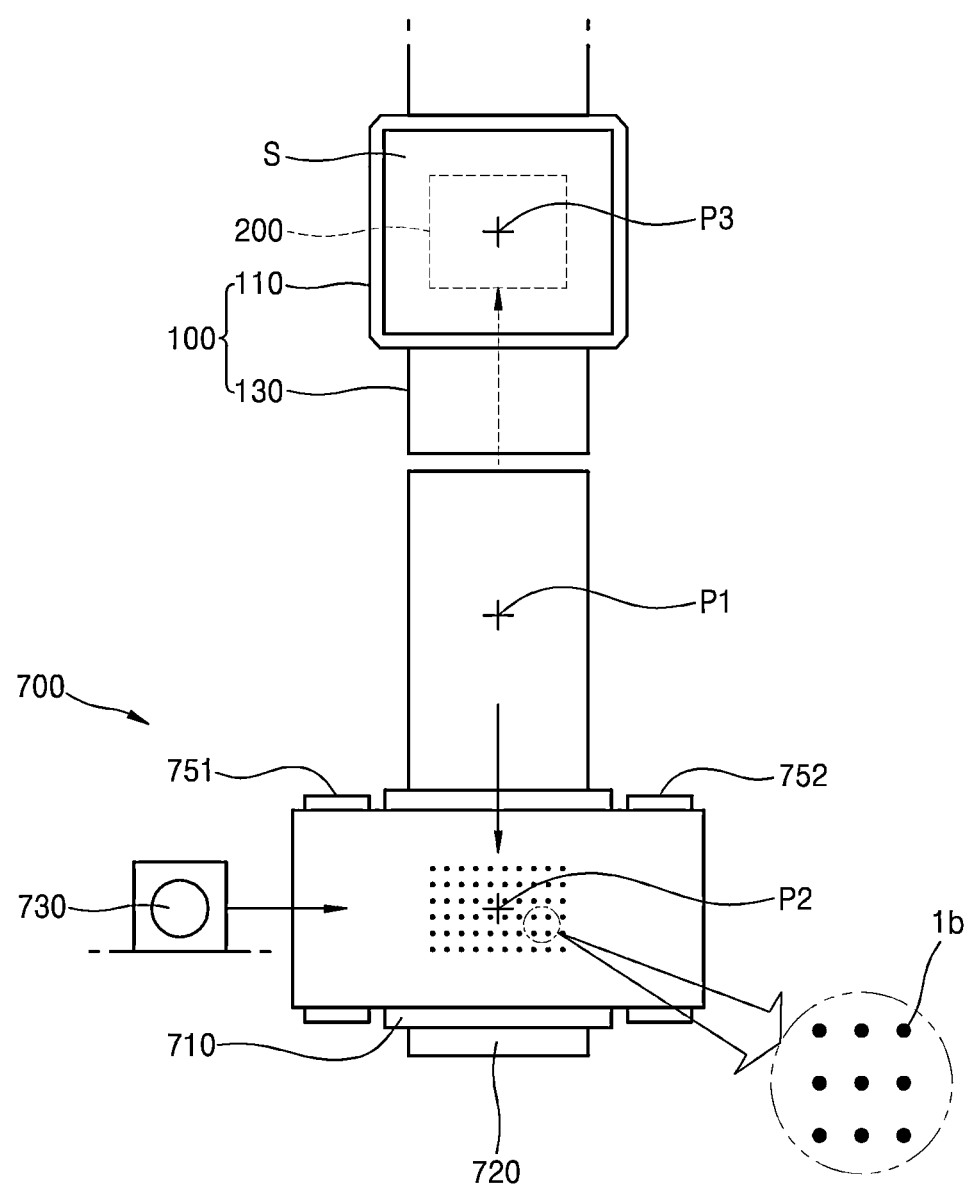
FIG. 6 is an enlarged plan view showing a printing state and a photographing state of the treatment liquid ejection apparatus of FIG. 5.

FIG. 4 is an enlarged plan view showing a printing state of the treatment liquid ejection apparatus 10 of FIG. 3, FIG. 5 is an enlarged plan view showing a test printing state of the treatment liquid ejection apparatus 10 of FIG. 4, and FIG. 6 is an enlarged plan view showing a printing state and a photographing state of the treatment liquid ejection apparatus 10 of FIG. 5.

As shown in FIGS. 1 to 6, the inspection unit 700 of the treatment liquid ejection apparatus 10 according to some embodiments of the present invention may include an inspection plate 710 positioned at a standby position P1 to allow the head unit 200 to test-eject a treatment liquid, an inspection plate moving unit 720 for moving the inspection plate 710 from the standby position P1 to a photographing position P2, the camera 730 for capturing an image of the treatment liquid ejected onto the inspection plate 710 moved to the photographing position P2, a camera moving unit 740 for moving the camera 730 on the basis of the photographing position P2, and a film supply unit 750 for supplying a film F for test printing onto the inspection plate 710.

Herein, when the first moving unit 300 moves the head unit 200 in a first direction and the second moving unit 400 moves the head unit 200 in a second direction, the inspection plate moving unit 720 may move the inspection plate 710 in the first direction and the camera moving unit 740 may move the camera 730 in the second direction.

The inspection plate 710 is provided with a porous adsorption plate 711 to flatly adsorb the film F, and the film supply unit 750 may include an unwinding roll 751 for supplying the film F onto the inspection plate 710, and a winding roll 752 for rewinding the film F from the inspection plate 710.

Operation of the treatment liquid ejection apparatus 10 according to some embodiments of the present invention will now be described with reference to FIGS. 4 to 6. Initially, as shown in FIG. 4, the head unit 200 may print the treatment liquid on the substrate S at a printing position P3 of a printing zone PZ in a print mode.

In this case, the inspection plate 710 may stand by at the standby position P1 of a maintenance zone MZ.

Then, as shown in FIG. 5, the head unit 200 may be moved to the standby position P1 of the maintenance zone MZ to print the treatment liquid on the film F of the inspection plate 710 in the form of a dot in a test print mode.

Thereafter, as shown in FIG. 6, using print file information of previous version information M1 already generated in a previous test printing process, the head unit 200 may immediately move to the printing position P3 of the printing zone PZ and rapidly print the treatment liquid on the substrate S after test printing is finished at the standby position P1 of the maintenance zone MZ without waiting until test image information, nozzle-specific characteristic information, and print file information to be described below are sequentially generated.

Figure 7:
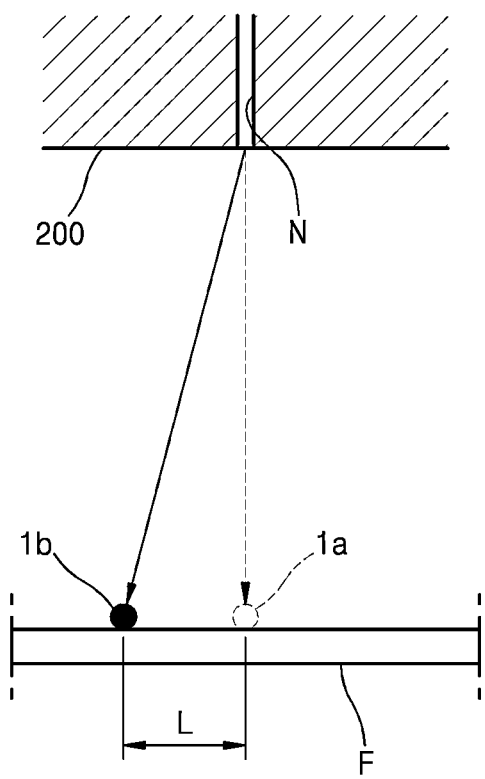
FIG. 7 is a conceptual view showing an impact point error of a treatment liquid of the treatment liquid ejection apparatus of FIG. 6.
Figure 8:
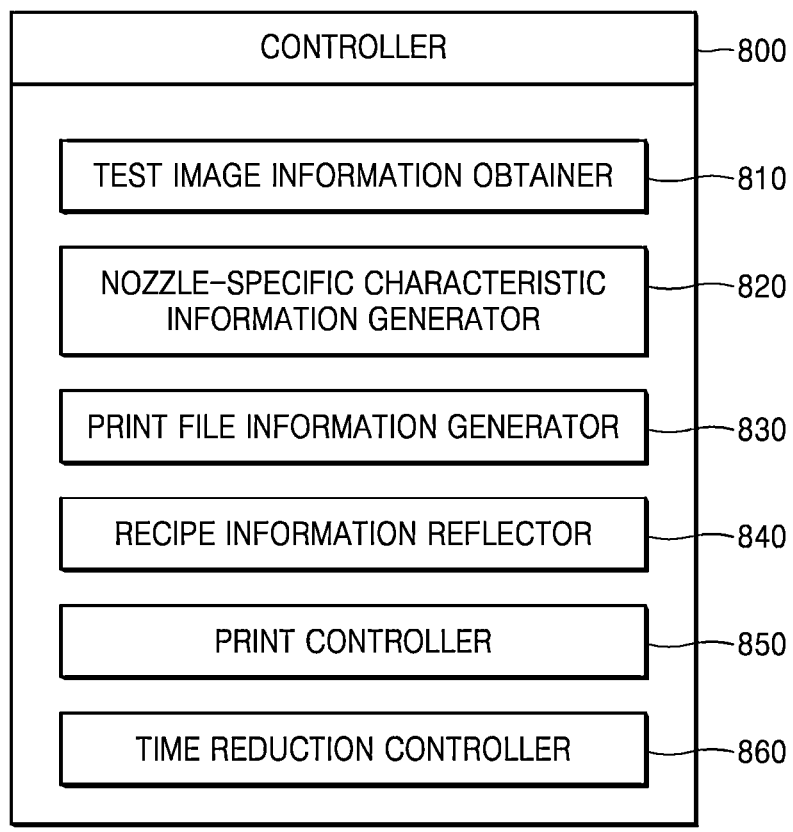
FIG. 8 is a block diagram of a controller of the treatment liquid ejection apparatus of FIG. 1.

FIG. 7 is a conceptual view showing an impact point error L of a treatment liquid 1 of the treatment liquid ejection apparatus 10 of FIG. 6, and FIG. 8 is a block diagram of the controller 800 of the treatment liquid ejection apparatus 10 of FIG. 1.

As shown in FIGS. 1 to 8, the controller 800 serves to apply an inspection control signal to the inspection unit 700 to control the inspection unit 700 to inspect a condition of the treatment liquid 1 ejected from the head unit 200 during a substrate preparation time when the substrate S is loaded onto the substrate support unit 100 and aligned at a correct position, and may include a test image information obtainer 810 for obtaining test image information by test-photographing, at the photographing position P2, the treatment liquid 1 test-printed by the head unit 200 at the standby position P1 during the substrate preparation time, a nozzle-specific characteristic information generator 820 for generating nozzle N-specific characteristic information by using the test image information, a print file information generator 830 for generating print file information in the form of a bitmap image or computer-aided design (CAD) file to be printed, in consideration of the nozzle-specific characteristic information, a recipe information reflector 840 for reflecting recipe information of the substrate S or the head unit 200 to prepare the print file information in an outputtable state, and a print controller 850 for applying a print control signal to the head moving units 300 and 400 to move the head unit 200 to the printing position P3 to print the treatment liquid 1 on the substrate S based on the print file information to which the recipe information is reflected.

Herein, as shown in FIG. 7, the test image information may include image information showing, in the form of a dot, an actual position 1b of each impact point where the treatment liquid 1 ejected from a specific nozzle of the head unit 200 reaches, the nozzle-specific characteristic information may include nozzle analysis information to which the impact point error L indicating a deviation between the actual position 1b and a correct position 1a of the impact point is reflected per nozzle, and the print file information may include a bitmap image or CAD file to which the nozzle-specific characteristic information is reflected.

Figure 10:
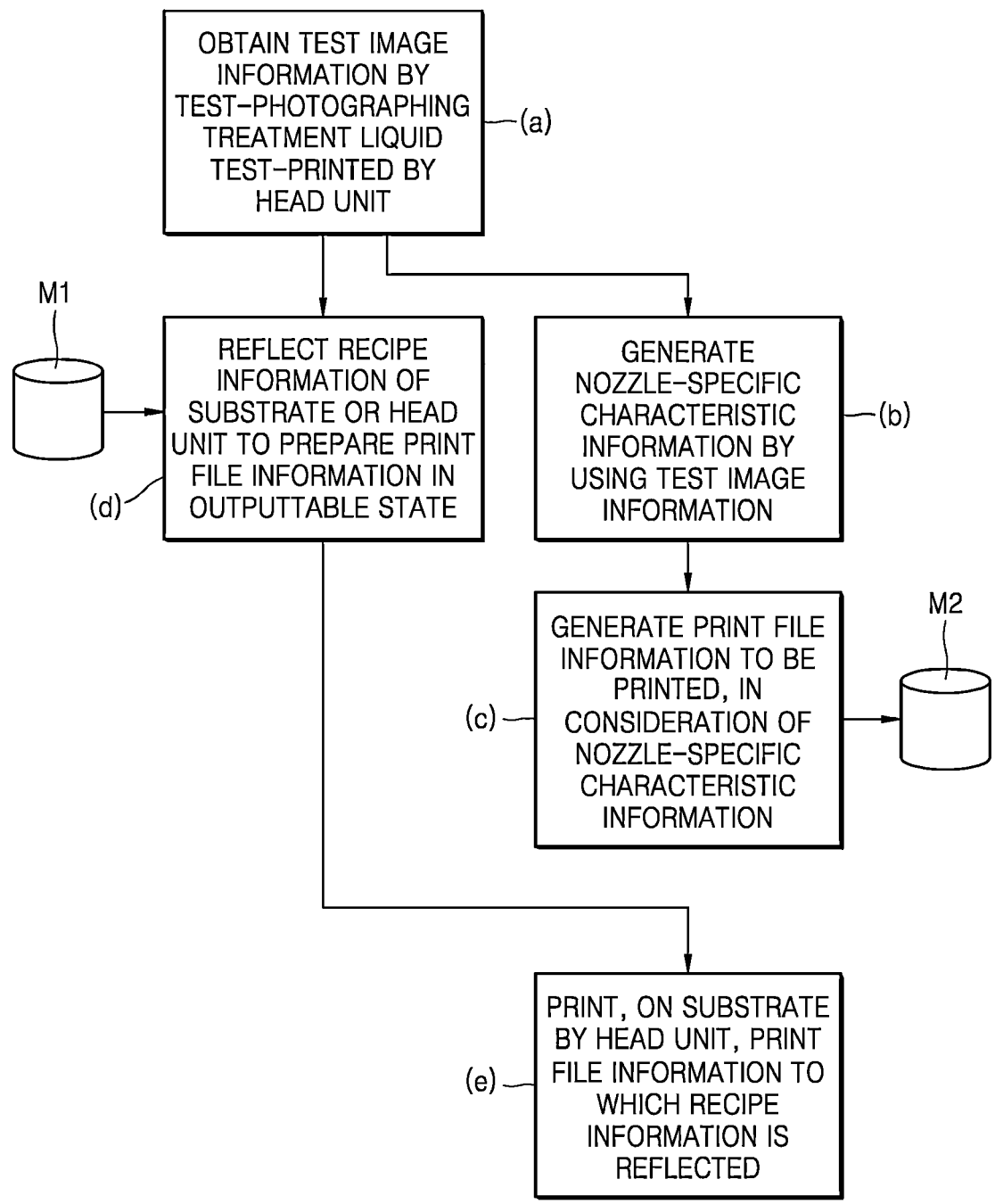
FIG. 10 is a flowchart of a treatment liquid ejection method according to other embodiments of the present invention.

In order to allow the head unit 200 to immediately move to the printing position P3 of the printing zone PZ and rapidly print the treatment liquid 1 on the substrate S after test printing is finished at the standby position P1 of the maintenance zone MZ without waiting for a long time until the test image information, the nozzle-specific characteristic information, and the print file information are sequentially and completely generated, the controller 800 may further include a time reduction controller 860 for applying previous version information M1 already generated in a previous test printing process, which will be described below in relation to FIG. 10, as the print file information used by the recipe information reflector 840, and generating the test image information, the nozzle-specific characteristic information, and the print file information in parallel as next version information M2 to be applied to a next substrate, which will be described below in relation to FIG. 10.

Therefore, according to the present invention, a substrate printing process of the head unit 200 may be enabled during a file correction time by mounting the head moving units 300 and 400 and the inspection plate moving unit 720 independently, productivity and quality may be significantly increased by greatly reducing an idle time and a downtime of the head unit 200 by performing the substrate printing process by using print file information of previous version information M1 and, at the same time, generating print file information of next version information M2 in parallel, quality may be noticeably increased by preventing frequent nozzle drying or nozzle clogging of the head unit 200 due to a long idle time, maintenance time, or downtime including the file correction time, and a lifespan of the head unit 200 may be remarkably increased in the long term.

That is, according to the present invention, it is verified in the field that, because only a very small difference occurs even when previous-version information is applied to a current substrate to inspect the head unit 200 each time while the head unit 200 is maintained in a wet state, productivity may be significantly increased by more than about 21% compared to the past by greatly reducing an idle time and an inspection time of the head unit 200 based on the above result and an impact point error rate may be remarkably improved by more than 90% by keeping the head unit 200 wet.

Herein, one test printing process may be performed each time before one substrate is printed, or a plurality of, e.g., two or three, substrates may be printed after one test printing process. That is, the previous version information M1 to be applied to a substrate to be printed is not limited to that of immediately previous test printing, and test printing may be performed only when necessary to reduce the amount of a treatment liquid used.

Figure 9:
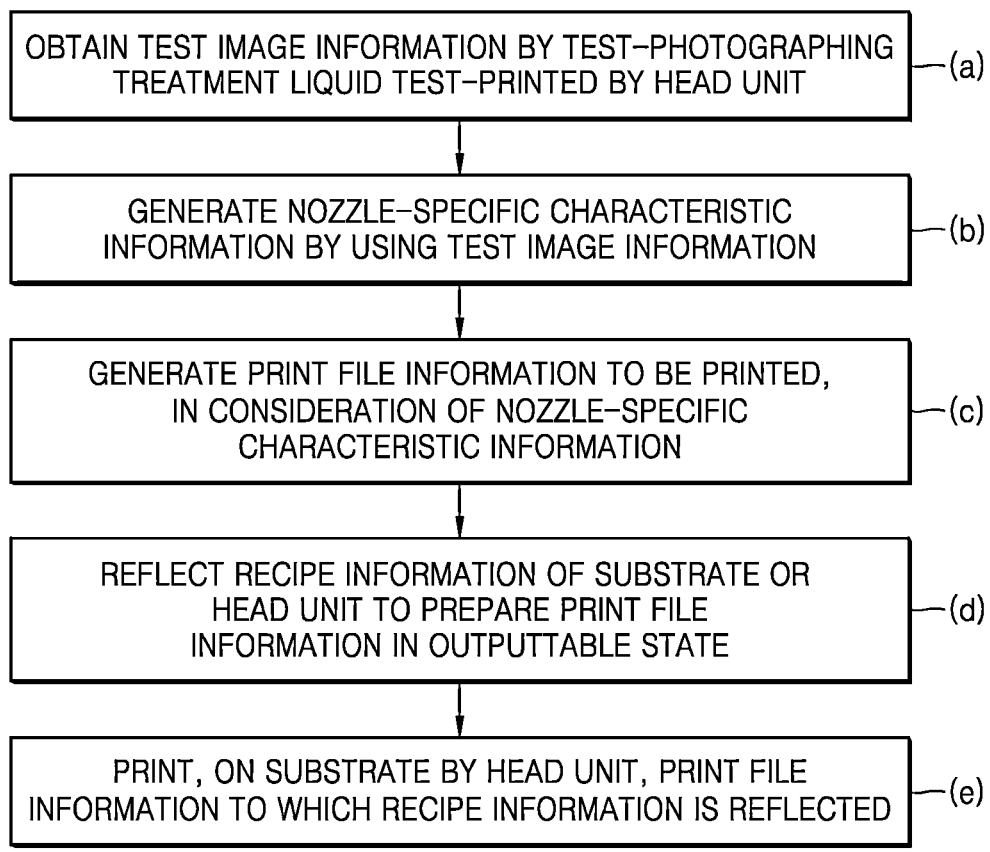
FIG. 9 is a flowchart of a treatment liquid ejection method according to some embodiments of the present invention.

FIG. 9 is a flowchart of a treatment liquid ejection method according to some embodiments of the present invention.

As shown in FIGS. 1 to 9, the treatment liquid ejection method according to some embodiments of the present invention may include (a) obtaining test image information by test-photographing the treatment liquid 1 test-printed by the head unit 200, (b) generating nozzle-specific characteristic information by using the test image information, (c) generating print file information to be printed, in consideration of the nozzle-specific characteristic information, (d) reflecting recipe information of the substrate S or the head unit 200 to prepare the print file information in an outputtable state, and (e) printing, on the substrate S by the head unit 200, the print file information to which the recipe information is reflected.

In step (a), the test image information may include image information showing, in the form of a dot, an actual position 1b of each impact point where the treatment liquid 1 ejected from a specific nozzle of the head unit 200 reaches, in step (b), the nozzle-specific characteristic information may include nozzle analysis information to which the impact point error L indicting a deviation between the actual position 1b and a correct position 1a of the impact point is reflected per nozzle and, in step (c), the print file information may include a bitmap image or CAD file to which the nozzle-specific characteristic information is reflected.

When steps (a) to (e) may be sequentially performed, because the number of nozzles reaches tens of thousands, the amount of information generated in each step may be very large, a time taken for complicated calculation of a computer may be increased, and thus an idle time when the head unit 200 merely waits without performing printing may also be increased.

FIG. 10 is a flowchart of a treatment liquid ejection method according to other embodiments of the present invention.

As shown in FIGS. 1 to 10, in the treatment liquid ejection method according to other embodiments of the present invention, in order to allow step (d) to be performed simultaneously with step (b) while steps (b) and (c) are being sequentially performed after step (a) of FIG. 9, the print file information of step (d) may be previous version information M1 already generated in a previous test printing process, and the test image information of step (a), the nozzle-specific characteristic information of step (b), and the print file information of step (c) may be next version information M2 to be applied to a next substrate.

Therefore, in step (a), the head unit 200 may perform test printing at the standby position P1 of the maintenance zone MZ and, in step (e), the head unit 200 may immediately move to the printing position P3 of the printing zone PZ and rapidly print the treatment liquid 1 on the substrate S without waiting until the test image information of step (a), the nozzle-specific characteristic information of step (b), and the print file information of step (c) are all sequentially generated.

Figure 11:
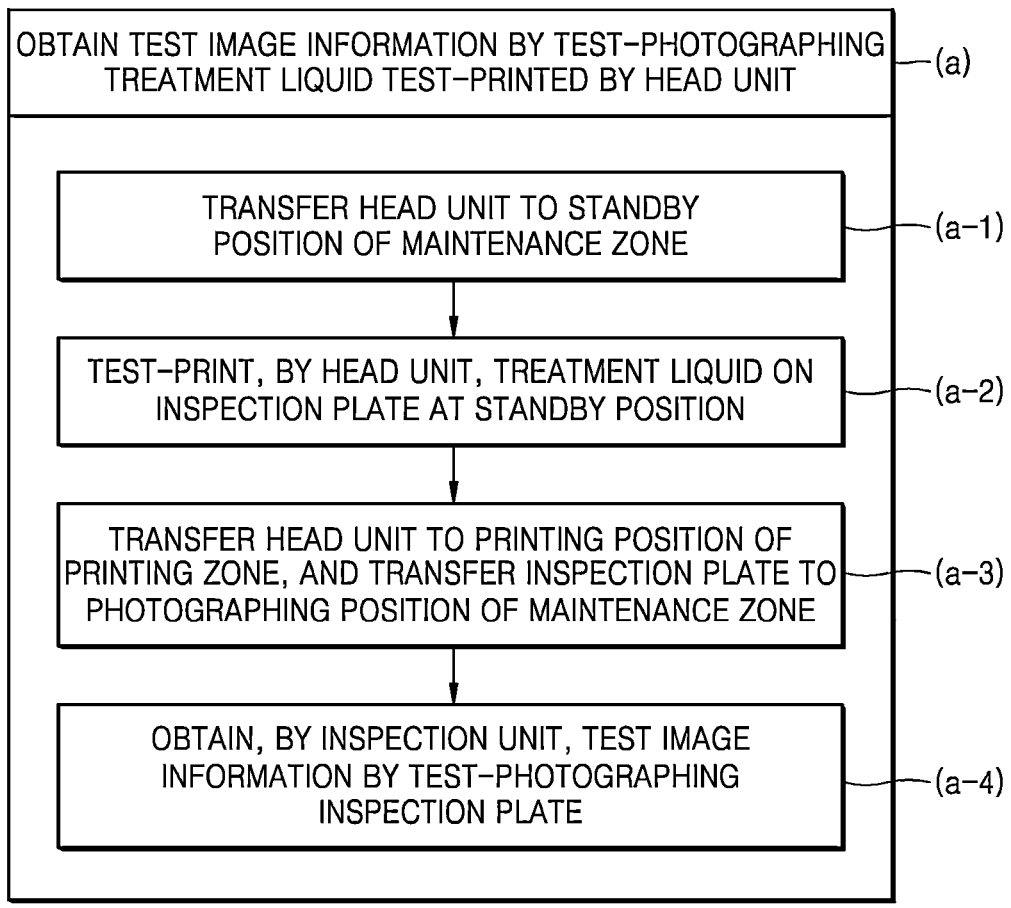
FIG. 11 is a detailed flowchart of step (a) of the treatment liquid ejection method of FIG. 10.

FIG. 11 is a detailed flowchart of step (a) of the treatment liquid ejection method of FIG. 10.

As shown in FIGS. 1 to 11, step (a) may include (a-1) transferring the head unit 200 to the standby position P1 of the maintenance zone MZ, (a-2) test-printing, by the head unit 200, the treatment liquid 1 on the inspection plate 710 at the standby position P1, (a-3) transferring the head unit 200 to the printing position P3 of the printing zone PZ, and transferring the inspection plate 710 to the photographing position P2 of the maintenance zone MZ, and (a-4) obtaining, by the inspection unit 700, test image information by test-photographing the inspection plate 710.

In step (a-3), in order to allow step (d) to be performed simultaneously, the head unit 200 prints, on the substrate S, the print file information which is the previous version information M1 already generated in a previous test printing process.

Therefore, because the head unit 200 may immediately perform printing by using the previous version information M1 without waiting until a plurality of pieces of information are generated, a maintenance time may be greatly reduced and productivity may be significantly increased and, because the head unit 200 may be maintained in a wet state, an impact point error rate may be reduced and product quality may be remarkably increased.

Figure 12:
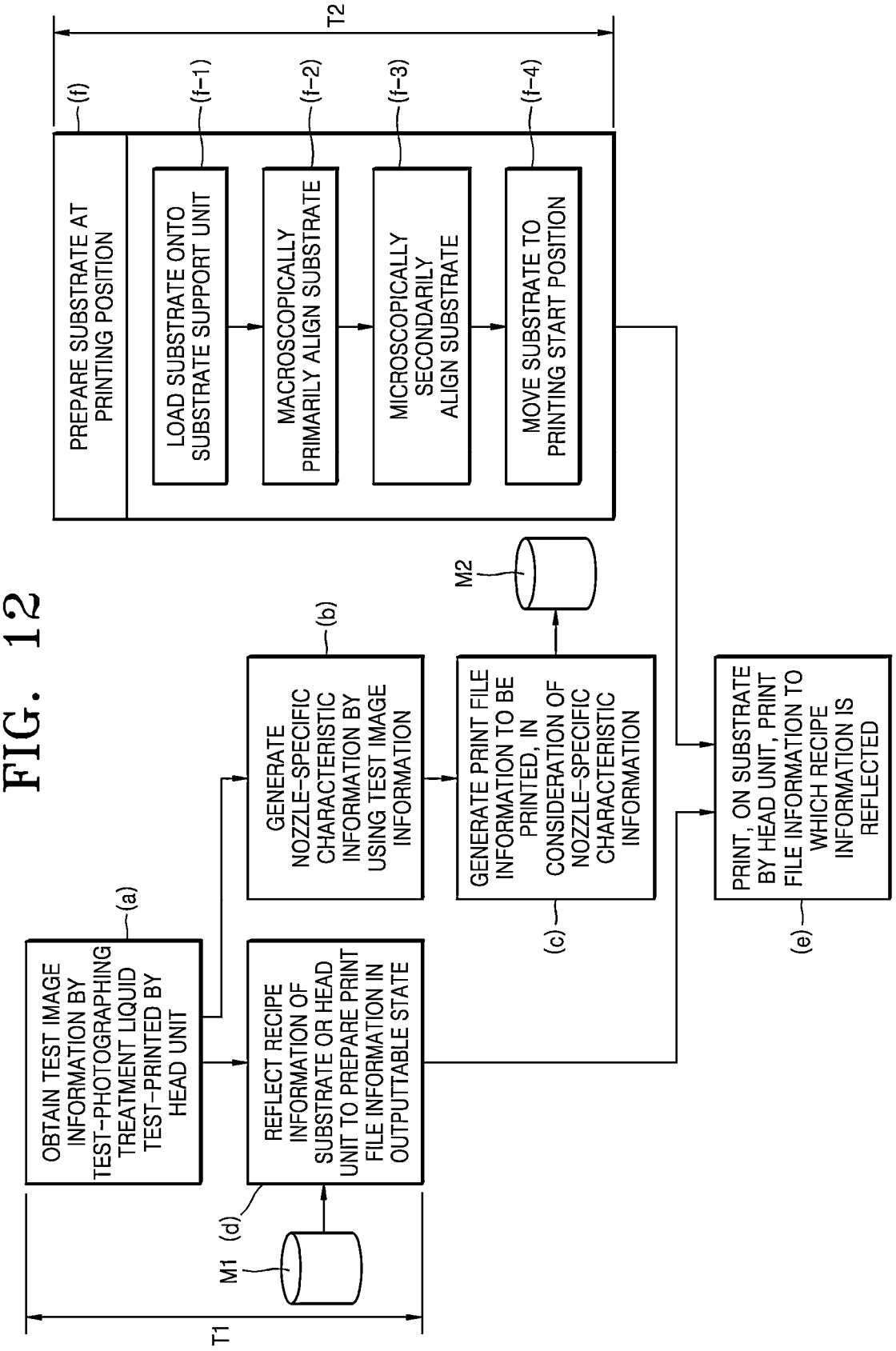
FIG. 12 is a flowchart of a treatment liquid ejection method according to other embodiments of the present invention.

FIG. 12 is a flowchart of a treatment liquid ejection method according to other embodiments of the present invention.

As shown in FIGS. 1 to 12, the treatment liquid ejection method according to other embodiments of the present invention may further include (f) preparing the substrate S at the printing position P3, before step (e) of FIG. 10.

Step (f) may include (f-1) loading the substrate S onto the substrate support unit 100, (f-2) macroscopically primarily aligning the substrate S, (f-3) microscopically secondarily aligning the substrate S, and (f-4) moving the substrate S to a printing start position.

Therefore, because a first required time T1 for steps (a) and (d) may be less than a second required time T2 for step (f), a maintenance time may be greatly reduced and productivity may be significantly increased and, because the head unit 200 may be maintained in a wet state during this time, an impact point error rate may be reduced and product quality may be noticeably increased.

Meanwhile, the print file information of step (d), which is the previous version information M1, may be applied to a plurality of substrates S.

Therefore, the amount of a very high-priced treatment liquid used in test printing may be greatly reduced and thus many economic benefits may be obtained.

According to the afore-described embodiments of the present invention, a substrate printing process of a head unit may be enabled during a file correction time by mounting a head moving unit and an inspection stage moving unit independently, productivity and quality may be significantly increased by greatly reducing an idle time or a downtime of the head unit by performing the substrate printing process by using print file information of a previous version and, at the same time, generating print file information of a next version in parallel, quality may be noticeably increased by preventing frequent nozzle drying or nozzle clogging of the head unit due to a long idle time, maintenance time, or downtime including the file correction time, and a lifespan of the head unit may be remarkably increased in the long term. However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A treatment liquid ejection method comprising:
   (a) obtaining test image information by test-photographing a treatment liquid test-printed by a head unit;
   (b) generating nozzle-specific characteristic information by using the test image information;
   (c) generating print file information to be printed, in consideration of the nozzle-specific characteristic information;
   (d) reflecting recipe information of a substrate or the head unit to prepare the print file information in an outputtable state; and
   (e) printing, on the substrate by the head unit, the print file information to which the recipe information is reflected.

2. The treatment liquid ejection method of claim 1, wherein, in order to allow step (d) to be performed simultaneously with step (b) while steps (b) and (c) are being sequentially performed after step (a), the print file information of step (d) is previous version information already generated in a previous test printing process, and the test image information of step (a), the nozzle-specific characteristic information of step (b), and the print file information of step (c) are next version information to be applied to a next substrate.

3. The treatment liquid ejection method of claim 2, wherein, in step (a), the head unit performs test printing at a standby position of a maintenance zone, and
    wherein, in step (e), the head unit immediately moves to a printing position of a printing zone and rapidly prints the treatment liquid on the substrate without waiting until the test image information of step (a), the nozzle-specific characteristic information of step (b), and the print file information of step (c) are all sequentially generated.

4. The treatment liquid ejection method of claim 2, wherein the print file information of step (d), which is the previous version information, is applied to a plurality of substrates.

5. The treatment liquid ejection method of claim 1, wherein, in step (a), the test image information comprises image information showing, in a form of a dot, an actual position of each impact point where the treatment liquid ejected from a specific nozzle of the head unit reaches,
    wherein, in step (b), the nozzle-specific characteristic information comprises nozzle analysis information to which an impact point error indicting a deviation between the actual position and a correct position of the impact point is reflected per nozzle, and
    wherein, in step (c), the print file information comprises a bitmap image or computer-aided design (CAD) file to which the nozzle-specific characteristic information is reflected.

6. The treatment liquid ejection method of claim 1, further comprising (f) preparing the substrate at a printing position, before step (e).

7. The treatment liquid ejection method of claim 6, wherein step (f) comprises:
    (f-1) loading the substrate onto a substrate support unit;
    (f-2) macroscopically primarily aligning the substrate;
    (f-3) microscopically secondarily aligning the substrate; and
    (f-4) moving the substrate to a printing start position.

8. The treatment liquid ejection method of claim 7, wherein a first required time for steps (a) and (d) is less than a second required time for step (f).

9. The treatment liquid ejection method of claim 1, wherein step (a) comprises:
    (a-1) transferring the head unit to a standby position of a maintenance zone;
    (a-2) test-printing, by the head unit, the treatment liquid on an inspection plate at the standby position;
    (a-3) transferring the head unit to a printing position of a printing zone, and transferring the inspection plate to a photographing position of the maintenance zone; and
    (a-4) obtaining, by an inspection unit, test image information by test-photographing the inspection plate.

10. The treatment liquid ejection method of claim 9, wherein, in step (a-3), in order to allow step (e) to be performed simultaneously, the head unit prints, on the substrate, the print file information which is previous version information already generated in a previous test printing process.

11. A treatment liquid ejection method comprising:
    (a) obtaining test image information by test-photographing a treatment liquid test-printed by a head unit;
    (b) generating nozzle-specific characteristic information by using the test image information;
    (c) generating print file information to be printed, in consideration of the nozzle-specific characteristic information;
    (d) reflecting recipe information of a substrate or the head unit to prepare the print file information in an outputtable state; and
    (e) printing, on the substrate by the head unit, the print file information to which the recipe information is reflected,
    wherein, in order to allow step (d) to be performed simultaneously with step (b) while steps (b) and (c) are being sequentially performed after step (a), the print file information of step (d) is previous version information already generated in a previous test printing process, and the test image information of step (a), the nozzle-specific characteristic information of step (b), and the print file information of step (c) are next version information to be applied to a next substrate,
    wherein step (a) comprises:
    (a-1) transferring the head unit to a standby position of a maintenance zone;
    (a-2) test-printing, by the head unit, the treatment liquid on an inspection plate at the standby position;
    (a-3) transferring the head unit to a printing position of a printing zone, and transferring the inspection plate to a photographing position of the maintenance zone; and
    (a-4) obtaining, by an inspection unit, test image information by test-photographing the inspection plate, and
    wherein, in step (a-3), in order to allow step (d) to be performed simultaneously, the head unit prints, on the substrate, the print file information which is previous version information already generated in a previous test printing process.

\* \* \* \* \*